United States Patent [19]

Diamant et al.

[11] Patent Number: 5,514,729

[45] Date of Patent: May 7, 1996

[54] ULTRAVIOLET HARDENABLE, SOLVENTLESS ELECTRICALLY CONDUCTIVE POLYMERIC MATERIAL

[75] Inventors: Joram Diamant, Moraga; Henry L. Myers, San Jose, both of Calif.

[73] Assignee: Sophia Systems Co., Ltd., Tokyo, Japan

[21] Appl. No.: 495,196

[22] Filed: Jun. 27, 1995

Related U.S. Application Data

[63] Continuation of Ser. No. 153,816, Nov. 17, 1993, abandoned.

[51] Int. Cl.$^6$ .................. H01B 1/02; C08G 59/22; C08K 3/08
[52] U.S. Cl. .................. 522/81; 522/25; 522/31; 522/83; 522/170; 252/513; 252/514; 252/501.1
[58] Field of Search .................. 252/513, 514, 252/501.1; 522/81, 170, 83, 25, 31

[56] References Cited

U.S. PATENT DOCUMENTS

| | | | |
|---|---|---|---|
| Re. 31,411 | 10/1983 | Bolon et al. | 252/501.1 |
| 3,776,729 | 12/1973 | Levy et al. | 522/170 |
| 3,989,644 | 11/1976 | Bolon et al. | 252/514 |
| 4,088,801 | 5/1978 | Bolon et al. | 252/514 |
| 4,435,214 | 3/1984 | Ehrreich | 75/251 |
| 4,759,970 | 7/1988 | Seeger, Jr. et al. | 428/209 |
| 4,999,136 | 3/1991 | Su et al. | 252/513 |
| 5,155,143 | 10/1992 | Koleske | 522/170 |
| 5,158,989 | 10/1992 | Ogitani et al. | 522/170 |
| 5,180,523 | 1/1993 | Durand et al. | 252/512 |
| 5,183,593 | 2/1993 | Durand et al. | 252/514 |

FOREIGN PATENT DOCUMENTS

| | | | |
|---|---|---|---|
| 0234347A1 | 9/1987 | European Pat. Off. | H01B 1/22 |
| 0402546A2 | 12/1990 | European Pat. Off. | H05K 3/12 |
| 0627873A1 | 12/1994 | European Pat. Off. | H05K 3/14 |

OTHER PUBLICATIONS

P. J.-M. Manus "Coating Performances and Formulation Parameters of Cationic Systems", Conference Proceedings RADTECH Europe '89, Florence, Italy, Oct. 9–11, 1989.

Ernest W. Flick, "Adhesives, Sealants and Coatings for the Electronics Industry", Second Edition, Noyes Publications, Park Ridge, NJ, 1992 pp. 328–419.

S. Peter Pappas and John G. Woods, "Radiation Curable Adhesives with Auxillary Cure Mechanisms", in *Radiation Curing of Polymers*, Special Publication No. 89, The Proceedings of the Third International Symposium organised by the North West Region of the Industrial Division of the Royal Society of Chemistry, U.M.I.S.T., Manchester, Sep. 12–14, 1990, pp. 147–159.

Dow Chemical Company Data Sheet (I), Formulating Adhesives with DOW Epoxy Resins, Two–Component Epoxy Putty.

Dow Chemical Company Data Sheet (II), Formulating Adhesives with DOW Epoxy Resins, General Purpose Adhesive.

*Primary Examiner*—Susan W. Berman
*Attorney, Agent, or Firm*—Leo V. Novakoski

[57] ABSTRACT

A dimensionally stable, UV hardenable polymeric composition is provided in which a conductive filler material is combined with a solventless resin formulation comprising a low viscosity epoxide compound, a photo initiator, and a thermal cure initiator. The properties of the polymeric composition may be adjusted through the addition of reactive diluents, poly alcohol flexiblizers, and acrylate based polymers, photo initiators, and thermal cure initiators. Conductive traces produced by extruding the polymeric composition through a syringe are subjected to a preliminary UV hardening step followed by deposition of an insulator layer and additional conductive traces, until all layers of conductive traces have been deposited. The structure is then subjected to heat until the conductive traces are fully cured. The formulation and the process described produce traces with bulk conductivity at least two times higher than any comparable conductive polymer, without using solvents. This process is purely additive, non-polluting and does not produce waste.

9 Claims, No Drawings

ULTRAVIOLET HARDENABLE, SOLVENTLESS ELECTRICALLY CONDUCTIVE POLYMERIC MATERIAL

RELATED APPLICATIONS

This is a continuation of application Ser. No. 08/153,816 filed on Nov. 17, 1993 now abandoned.

TECHNICAL FIELD

This invention relates to conductive polymeric compositions, and more particularly to solventless, ultraviolet (UV) hardenable polymeric compositions for producing conductive traces on circuit boards.

BACKGROUND OF THE INVENTION

The conductive elements that connect electronic components on a circuit board and couple signals around a circuit board may be produced by "writing" conductive traces on the board material with a conductive polymeric composition. Typically, the polymeric material comprises a conductive filler which is dispersed in a resin formulation that includes solvents to reduce viscosity. The resulting conductive polymeric material is extruded in its uncured state through a syringe-like apparatus which is translated over the circuit board to deposit conductive traces in the desired circuit pattern or screen printed through a pattern created by a stencil. For certain known conductive polymeric materials, traces formed of such materials are periodically cured by heating the material to evaporate the solvents.

Ideally, conductive polymeric compositions are cured quickly and thoroughly so that insulator layers and additional conductive traces can be added directly over the cured conductive traces without causing short circuits. In addition, the conductive traces must maintain good electrical contact with the metal pads to which electrical components and leads are connected. The material should also maintain its conductive properties through the curing process. This is particularly important where the conductive traces from arcuate sections, such as curves and 'hops' over previously deposited traces. The arcuate geometry creates uneven stresses in the conductive traces which may be exacerbated by curing. Further, it is often necessary to deposit the conductive material in vias, which are narrow diameter passages through the circuit board for connecting circuitry on opposite sides of the board. Suitable materials must be readily cured despite the limited exposed surface area available for solvent evaporation in vias.

To achieve the desired conductivity while maintaining the low viscosities necessary for extruding circuit traces, conventional conductive polymeric materials contain solvents. Solvents reduce the viscosity of conventional conductive polymeric materials and increase the concentration of conductive filler material when they evaporate following deposition.

The solvent content of conventional conductive polymeric materials limits their effectiveness for writing circuits in the manner described above, since the loss of solvent alters the characteristics of the conductive traces. For example, conventional solvent based materials may shrink up to 50% on curing. This dimensional instability creates cracks in the conductive traces, particularly along arcuate sections and hops, and the conductive trace may break completely if its volume changes sufficiently. Similarly, contacts with metal pads are easily broken as the shrinking resin volume pulls the conductive trace away from the pad, and the conductive polymeric material can be blown out of vias by escaping solvent.

Solvent evaporation causes a number of problems in addition to those associated with dimensional instability. For example, evaporation of solvents prior to curing changes the composition of the conductive polymer materials, and leads to inconsistencies in the material viscosity from batch to batch. Further, evaporating solvents may leave air pockets in the material, altering its physical properties in unpredictable ways.

It is thus desirable to develop dimensionally stable conductive polymeric materials having uniform consistencies and the low viscosities necessary for depositing narrow diameter conductive traces. Most commercially available UV curable resins are inadequate for circuit writing applications. For example, UV cured acrylates have poor adhesion to metals. Also, UV cure of acrylates is oxygen inhibited, resulting in a tacky surface due to incomplete curing. Further, silver which is the standard conductive filler material, may catalyze polymerization of many formulations at room temperature before exposure to UV radiation. Once polymerized, these acrylate formulations cannot be used to write circuit patterns.

SUMMARY OF THE INVENTION

In accordance with the present invention, a dimensionally stable, UV hardenable conductive polymeric composition is provided which combines a conductive filler material with a solventless, resin formulation comprising a low viscosity epoxide monomer having at least two epoxide groups, a photo initiator for triggering UV hardening, and a thermal cure initiator for triggering heat curing of the polymeric composition. Surface hardening of conductive traces produced from polymeric compositions in accordance with the present invention allows rapid, successive deposition of multiple insulating and conductive trace layers without risk of electrical shorting. Further, the solventless resin formulation produces conductive traces that substantially retain their shape, consistency, and electrical continuity through the curing process.

The properties of conductive polymeric compositions in accordance with the present invention may be further adjusted by means of various additives. For example, the viscosity of the resin formulation may be decreased by adding reactive diluents, and the flexibility of the conductive traces may be increased by including poly alcohols or other flexiblizers in the resin formulation. The low viscosity of the resin formulation allows it to be loaded with up to 50% by volume (greater than 85% by weight) of conductive filler material without impeding its extrusion through nozzles having inner diameters as small as 0.004". Further, the loading of the resin formulation and the geometry of the particles of conductive filler material may be selected to produce resistivities that are less than half as high as the resistivities of the most conductive conventional materials after solvent evaporation. Resin formulations of the present invention may also include small amounts of acrylate resins to improve the curing response of the circuit traces to UV radiation. In this case, a stabilizer is included to prevent prenature polymerization.

DESCRIPTION OF THE PREFERRED EMBODIMENTS

Solventless, UV hardenable conductive polymeric materials in accordance with the present invention eliminate the material consistency and electrical continuity problems associated with circuit traces produced with solvent based compositions. In addition, the UV hardening property of these conductive polymeric compositions allows rapid processing of circuit boards having multiple layers of circuit traces. UV hardening may be accomplished using radiation from a mercury or xenon mercury lamp with the intensities indicated in Table I. Full curing is accomplished by means of a thermal cure step following deposition of all conductive traces.

The primary ingredients of polymeric compositions in accordance with the present invention are the conductive filler material and the low viscosity resin formulation. The conductive filler material is selected from among electrically conductive particulate materials, such as silver, gold, palladium, and nickel, having sizes in the range of about 0.1 micron to about 20 microns. In a preferred embodiment, conductive particulates having elongated shapes with lengths of up to approximately 20 microns and thicknesses of approximately two microns or less are used. The elongation of these particulates is represented by their aspect ratio, which is the ratio of the dimension of the particle along the longest axis to the dimension of the particle along a lateral or orthogonal axis. The conductivity of polymeric compositions in accordance with the present invention increases with the aspect ratio of the conductive particulates. Illustrative of the conductive filler materials employed in the present invention are, for example, silver flakes which are available, from Degussa Metz Metalurgical Corporation.

The other primary ingredient of polymeric compositions in accordance with the present invention is the low viscosity resin formulation, comprising an epoxide compound, a photo-initiator, and a thermal cure initiator. Low viscosities are essential for this component, to insure that the final polymeric composition can be delivered through narrow diameter nozzles while still accommodating greater than 85% by weight of the conductive filler material. The low viscosity resin formulation is produced by selecting the resin component from among the low viscosity epoxide compounds, and where necessary, decreasing the viscosity of this component with a reactive diluent rather than with a solvent as is typically done in conventional conductive polymeric materials.

Low viscosity epoxide compounds for polymeric compositions in accordance with the present invention are selected from among epoxide compounds having at least two terminal epoxide groups and viscosities in the range of between about 200 centipoise (cps) and about 800 cps. Representative of the epoxides selected are those having the general formula:

R—M—R' where R and R' are each epoxide containing organic radicals such as cyclohexyl epoxides, linear alkyl epoxides or other suitable epoxide containing radicals, and M is a backbone moiety which links the two terminal epoxides. Exemplary of the low viscosity epoxide compounds useful in the present invention are: cycloaliphatic epoxies, where M=—CO—CH$_2$—O— or H$_2$C—CO—(CH$_2$)—O—CH$_2$ and
R=R'=C$_6$H$_{10}$O;

bisphenol A or F epoxies, where

M is

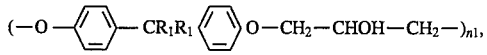

R$_1$=CH$_3$or H, and n1 is between 0 and 1,

R = CH$_2$OCH—CH$_2$—;

and

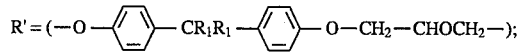

epoxy novolacs, where

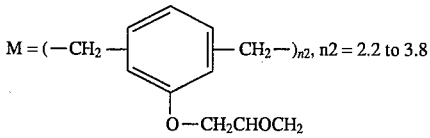

and

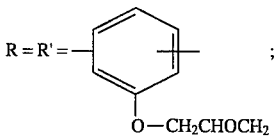

glycidyl ethers of para amino phenol, where

M = R—O—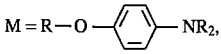—NR$_2$, and

R = R' = CH$_2$—CHOCH$_2$—.

It has been found that organic radicals selected from the epoxide substituted cycloalkyl groups and more particularly, from the epoxide substituted cyclohexyl radicals, have viscosities in the desired range. Generally, the viscosity increases with the number of rings in the molecule, and is higher for aromatic rings such as benzene, than for the corresponding alicyclic ring, cyclohexane. Viscosity is also higher for molecules in which R$_1$=CH$_3$ than for molecules in which R=H.

Illustrative of the epoxies used in the present invention are 3,4,-epoxy cyclohexyl methyl3,4-epoxy cyclohexyl carboxylate, which has a viscosity of 350–450 centipoise (cps) and is available commercially from Union Carbide Corporation as CYRACURE UVR 6110. A lower viscosity version (220–250 cps) of the above is also available commercially from Union Carbide as CYRACURE UVR 6105. Another alternative epoxy is bis (3,4-epoxy cyclohexyl methyl) adipate, which has a viscosity of 550–750 cps.

Epoxy formulations based on glycidyl ethers of para amino phenol, epoxy novolacs, and bisphenol F epoxy harden only slowly under exposure to UV radiation. However, these epoxies provide adhesion to metals that is superior to that provided by formulations based on epoxide substituted cycloaliphatic compounds. By combining formulations based on glycidyl ethers of para amino phenol, bisphenol F epoxy, or epoxy novolacs with, for example, epoxy formulations based on the epoxy substituted cycloalkyl groups discussed above, a low viscosity, UV hardenable, solventless epoxy formulation having superior adhesion may be formed.

The photo-initiator included in the resin formulations of the present invention initiates polymerization of the epoxy compound on exposure to UV radiation. In selecting a photo-initiator, it is important to recognize that free radical photo-initiators used to initiate polymerization in acrylates and vinyl based resin formulations are deactivated by reaction with oxygen and lose their photo-initiating properties. Deactivation of photo-initiators in the presence of oxygen limits hardening of the deposited polymeric composition, and leaves a tacky surface which can interact with subsequently deposited conductive traces to cause electrical shorts. In the preferred embodiment of the present invention, cationic photo initiators are used since these are not deactivated by reaction with oxygen. Examples of suitable cationic photo initiators are mixed salts of triarylsulfonium hexafluoroantimonate.

As discussed below, there are some circumstance in which it may be desirable to mix acrylate or vinyl resins with epoxides in the resin formulation. In these cases, radical photo-initiators such as 2-hydroxy-2-methyl-1-phenyl-propan-1-one must be included in the resin formulation as well. However, in these cases, the free radical photo-initiators constitute only 25% to 30% by weight of the photo-initiator components.

One difficulty in developing UV hardenable epoxies for use in conductive polymeric materials is that silver does not transmit UV radiation. As a result, the core regions of conductive polymer traces are shielded from UV radiation. In the compositions of the present invention which are up to 90% silver by weight, shielding of the core polymer material is very efficient, and these interior regions may not be adequately or completely cured by UV radiation. However, for purposes of depositing overlapping circuit traces without creating electrical shorts, only the outer surface of the conductive polymeric materials needs to be hardened in the UV radiation step. Typically, UV curing affects only the part of the polymeric composition which is concentrated at the surface of the conductive trace for the reason described above. The remainder of the resin formulation is cured thermally, once all the circuit traces have been completely deposited on the circuit board. For this purpose, the resin formulation includes thermal cure catalysts.

Typical of the thermal cure catalysts employed in the present invention are the amine complexes of boron trifluoride. For example, a boron trifluoride amine complex which is activated at 302° F. has a shelf life of 6 months in the epoxy formulation if stored at or below 77° F. Another boron trifluoride amine complex which is activated at 260° F. has a shelf life in the epoxy formulation of 6 to 10 weeks if stored below 77°. Where the resin formulation includes acrylates or vinyls, a dicumyl peroxide [bis(1-methyl-1-phenylethyl) peroxide] thermal cure catalyst may be added.

Generally, the maximum usable viscosity of a conductive polymeric composition is limited by the diameter of the conductive traces desired, with finer traces requiring lower viscosities for deposition through narrow diameter nozzles. For deposition through 0.004"diameter nozzles, viscosities in the range of about 85 cps to about 130 cps are necessary to avoid clogging the nozzle. In accordance with the present invention, when the viscosity of the resin formulation resulting from the combination of epoxide compound, photo-initiator, and thermal cure initiator is greater than about 130 cps, a reactive, low viscosity diluent may be added. Preferably, the reactive diluents have viscosities in the range of 1–10 cps, and suitable reactive diluents may be selected from among the more volatile mono-epoxides. For example, vinyl cyclohexene monoxide (1,2-epoxy-4-vinylcyclo-hexane) and 1,4-cyclohexane dimethanol divinyl ether have been used in resin formulations of the present invention to make up to 13% by weight of the resin formulation.

As noted above, it is important that the conductive polymeric traces establish and maintain good electrical contact with metal pads on the circuit board to which electronic components are connected. Accordingly, resin formulations of the present invention may include poly alcohols or polyols which not only promote adhesion to metals but also increase the flexibility of the polymer and, in some cases, act as thermal cure accelerators. Polyols for the present invention are typically selected from among the di or tri alcohols, and include triethylene glycol diol, caprolactone triol, and polyether triols such as glycerol-propylene oxide polyether triol. Diols and triols are employed in the present invention since they react with epoxides and have high boiling points (at least 285° C.). Consequently, they do not evaporate during curing and so do not contribute to volume changes in the polymeric composition.

The adhesion of an epoxy formulation to metal is correlated with the R factor which represents the ratio of epoxide functionalities to alcohol groups in the formulation. In particular, the adhesion of an epoxy formulation to metal improves as the R factor is reduced. Thus, the addition of polyols to the resin formulation improve its adhesion to metals by reducing the R factor. Generally, epoxy formulations having an R vector of between about 2 and about 10 are preferred for the present invention, and those with R factors between about 2 and about 3 are more preferable. Resin formulations in accordance with the present invention having R factors in the desired range are up to 35% polyols by weight and, preferably, are between about 12% and about 35% polyols by weight.

Certain advantages can be gained by adding acrylate resins to the epoxy based formulation of the present invention. For example, hybrid epoxy/acrylate based resin formulations can be UV hardened faster than resin formulations based solely on epoxy, due to the faster response of the acrylate resin component to UV radiation. Alternatively, if an epoxy/acrylate based resin formulation is subjected to the same UV dosage as an epoxy based formulation, the hybrid formulation will produce a tougher polymer. Examples of acrylates used in the conductive polymeric compositions of the present invention are partially acrylated bisphenol A epoxy and 1,6-hexanediol diacrylate. Hybrid based resin formulations also typically include stabilizers to prevent spontaneous polymerization of acrylates and vinyls by occasional free radicals. For example, benzene-1,4-dihydroxy has been used in certain formulations of the present invention for this purpose.

Resin formulations in accordance with the present invention may include additives to improve other aspects of performance. For example, hydrophobic silica may be added to the formulation to increase the viscosity of conductive polymeric compositions when the material is not under shear. Surfactants and dispersing agents may also be used, such as Silwet L-7604 which is available from Union Carbide and BYK-405 which is available from BYK Chemie.

Conductive polymeric compositions in accordance with the present invention are produced by mixing the ingredients of the resin formulation and the silver filler material under vacuum conditions. This method, which is not possible with solvent based resin formulations, minimizes the introduction of gas bubbles into the composition during mixing. As noted above, air pockets can cause anomalous extrusion of circuit traces and unpredictable variations in the properties of the trace material, such as increased resistance. Accordingly, the ingredients are added to a vacuum container and the pressure of the container is reduced to between about 500 mtorr and about 50 mtorr. The components are then mixed at a rate of between approximately 1000 and approximately 4000 RPM for between about ten minutes and about sixty minutes, depending on the ingredients used.

For example, resin formulations have been prepared by combining between about 30% and about 50% (by weight) of an epoxide compound having a viscosity in the selected range, with between about 3% and about 12% by weight of a photo-initiator, between about 1.5% and about 7% of a thermal cure catalyst, and between about 8% and about 13% of a reactive diluent. A conductive filler material comprising silver particulates having an aspect ratio of approximately 10 and a length of approximately 20 microns is added to the formulation to bring the total composition to 88% by weight of silver and 12% resin mixture. The pressure in the mixing vessel is then reduced to between about 500 mtorr and 50 mtorr and the ingredients are mixed at between 1000 RPM and 4000 RPM for between about ten minutes and about sixty minutes.

Examples of some of the resin formulations produced and tested are presented below, and the properties of these formulations are summarized in Table I. Descriptions of the mechanical properties are offered only to indicate how these properties vary relative to those of the other epoxy resin formulations described herein.

which is activated at about 302° F. (ANCHOR 1222). All other ingredients and mixing procedures are the same.

EXAMPLE 3

The resin formulation of example 1 in which caprolactone triol is eliminated and the epoxy component is 14% by weight of 3,4-epoxy cyclohexyl methyl-3,4-epoxy cyclohexyl carboxylate and 28% by weight of a low viscosity version of the same epoxide. All other ingredients and mixing procedures are the same.

EXAMPLE 4

The resin formulation of example 3 in which the boron trifluoride amine complex which is activated at about 260° F. is replaced with a 3% boron trifluoride amine complex which is activated at about 302° F. All other ingredients and mixing procedures are the same.

EXAMPLE 5

The resin formulation of example 3 in which the epoxy component is 14% by weight of 3,4-epoxy cyclohexyl methyl-3,4-epoxy cyclohexyl carboxylate and 26% by weight of bis (3,4epoxy cyclohexyl methyl) adipate. All

TABLE I

| Example No. | Resin Viscosity (cps) | UV Gel Dose (mJ/cm$^2$) | % thermal Cure | Mechanical Properties |
| --- | --- | --- | --- | --- |
| 01 | 108 | 600 | 84 | bendable, not tough |
| 02 | 108 | 600 | 82 | same |
| 03 | 94 | 600 | 84 | same |
| 04 | 94 | 600 | 82 | same |
| 05 | 134 | 600 | 80 | pliable, tough |
| 06 | 130 | 450 | 90 | bendable, v. tough, unbreakable |
| 07 | 102 | 600 | 90 | same |
| 08 | 88 | 45 | 97 | very tough |
| 09 | 135 | 45 | 94 | same |
| 10 | 85 |  | 89 | tough |
| 11 | 85 | 45 | 80 | not tough |
| 12 | 170 |  | 92 | bendable, strong |
| 13 | 230 |  | 80 | bendable, tough |

EXAMPLE 1

In a vacuum container, prepare a resin mixture comprising by % weight: 39.6% 3,4-epoxy cyclohexyl methyl-3,4-epoxy cyclohexyl carboxylate (CYRACURE UVR 6110), 14.9% glycerol-propylene oxide polyether triol (ARCOL LHT 112), 14.1% polyether triol (VORANOL 2228), 3.3% triethylene glycol, 1.3% caprolactone triol (TONE 305), 13% vinylcyclohexene monoxide (VCMX), 12.3% mixed salts of triarylsulfonium hexafluoroantimonate(CYRACURE UVI 6974), and 1.5% boron trifluoride amine complex activated at 260° F. (ANCHOR 1040). To the resin formulation add silver filler to bring the total composition to 88% by weight silver and 12% resin mixture. Reduce the pressure in the mixing vessel to between about 500 mtorr and about 50 mtorr and mix the ingredients at between about 1000 and about 4000 RPM for between approximately ten minute and approximately sixty minutes.

EXAMPLE 2

The resin formulation of example 1 in which the boron trifluoride amine complex which is activated at about 260° F. is replaced with a 3% boron trifluoride amine complex other ingredients and mixing procedures are the same.

EXAMPLE 6

In a vacuum container, prepare a resin mixture comprising by % weight: 33.0 % of the low viscosity form of 3,4-epoxy cyclohexyl methyl-3,4-epoxy cyclohexyl carboxylate, 17% by weight of bis (3,4-epoxy cyclohexyl methyl) adipate, 20% polyether triol, 2.5% triethylene glycol, 3% caprolactone triol, 9% 1,2-epoxy-4-vinylcyclo-hexane, 12% mixed salts of triarylsulfonium hexafluoroantimonate, and 3% boron trifluoride amine complex which is activated at 302° F. The mixing procedures are as described above.

EXAMPLE 7

The resin formulation of example 6, in which the caprolactone triol is eliminated and the epoxy component is 41% by weight of the low viscosity form of 3,4-epoxy cyclohexyl methyl-3,4-epoxy cyclohexyl carboxylate and 13% by weight of bis (3,4-epoxy cyclohexyl methyl) adipate. The mixing procedures are as described above.

EXAMPLE 8

The resin formulation comprising 50% by weight of 3,4-epoxy cyclohexyl methyl-3,4-epoxy cyclohexyl carboxylate, 13% caprolactone triol, 1% 1,4-cyclohexane dimethanol divinyl ether, 23% 1,6-hexanediol diacrylate, 10% mixed salts of triarylsulfonium hexafluoroantimonate, 3% 2-hydroxy-2methyl- 1-phenyl-propan- 1 -one, 0.01% hydroquinone, and 0.1% dicumyl peroxide. The mixing procedures are as described above.

EXAMPLE 9

The resin formulation of example 8, in which the % weights of 3,4-epoxy cyclohexyl methyl-3,4-epoxy cyclohexyl carboxylate, 1,6-hexanediol diacrylate, and caprolactone triol are 55%, 15% and 16%, respectively. The mixing procedures are as described above.

EXAMPLE 10

A resin formulation comprising 33% 3,4-epoxy cyclohexyl methyl-3,4epoxy cyclohexyl carboxylate, 7% glycerol-propyleneoxide polyether triol, 6% polyether triol, 1% triethylene glycol diol, 6% 1,4-cyclohexane dimethanol divinyl ether, 10% partially acrylated bisphenol A epoxy, 23% 1,6-hexanediol diacrylate, 10% mixed salts of triarylsulfonium hexafluoroantimonate, 4% 2-hydroxy-2-methyl-1-phenyl-propan-1-one, 0.01% hydroquinone, and 0.5% dicumyl peroxide. The mixing procedures are as described above.

EXAMPLE 11

The resin formulation of example 10 in which the dicumyl peroxide is eliminated and 1% hydrophobic fumed silica is added. The mixing procedures are as described above.

Examples 12 and 13 are epoxy formulations based on bisphenol F epoxy, and glycidyl ether of para amino phenol which harden only slowly under exposure to UV radiation. As discussed above, these formulations may be combined with any of the formulations of examples 1–11 to form a composite UV hardenable, solventless polymeric composition having improved adhesion properties.

EXAMPLE 12

A resin formulation comprising 52% bisphenol F epoxy, 18% glycerolpropylene oxide polyether triol, 17% vinyl cyclohexene monoxide, 3% triethylene glycol, and 10% boron trifluoride amine complex. The mixing procedures are as described above.

EXAMPLE 13

A resin formulation comprising 20% bisphenol F epoxy, 35% glycidyl ether of para amino phenol, 19% glycerol-propylene oxide polyether triol, 13% vinyl cyclohexene monoxide, 3% triethylene glycol, and 10% boron trifluoride amine complex. The mixing procedures are as described above.

Therefore, a conductive polymeric composition is presented in accordance with the present invention that provides high conductivity, dimensionally stable, UV hardenable conductive traces. The composition is suitable for writing circuit traces with narrow diameter nozzles. These benefits are obtained by combining a conductive filler material with a low viscosity, solventless epoxy resin formulation containing reactive diluents, a photo-initiator, and a thermal cure initiator under vacuum mixing conditions.

What is claimed is:

1. An extrudable, UV hardenable, thermally curable polymeric composition for use in forming electrically conductive traces on a substrate, the polymeric composition comprising:

a solventless, one part epoxy resin formulation, including between 33.0% and 54.9% by weight of an epoxide compound having at least two cycloaliphatic epoxide groups and a viscosity in the range of between about 200 cps and about 800 cps, between 11.8% and 14.0% by weight of a cationic photo initiator for initiating polymerization in response to UV radiation, between 0.1% and 10% by weight of a thermal cure catalyst for initiating polymerization in response to heat, between 1% and 17% by weight of a reactive diluent, and between 12.5% and 33.6% by weight of a poly alcohol; and silver particles forming between about 85% and 89% by weight of the polymeric composition; wherein the composition has an electrical volume resistivity of no more than 20 µΩ-cm when surface hardened by UV radiation and bulk polymerized by heat.

2. The polymeric composition of claim 1, wherein the silver particles have aspect ratios of between 1 and about 10 and sizes in the range of about one to about twenty microns.

3. The polymeric composition of claim 1, wherein the poly alcohol is selected from the group consisting of: glycerol-propylene oxide polyether triol, triethylene glycol, and caprolactone triol.

4. The polymer composition of claim 1, wherein the reactive diluent is an epoxide compound having a single epoxide group and a viscosity in the range of about 1 to about 10 cps.

5. The polymeric composition of claim 1, wherein the silver particles and the resin formulation are mixed together under reduced pressure.

6. The polymeric composition of claim 5, wherein the reduced pressure is between about 500 millitorr and about 50 mtorr.

7. The polymeric composition of claim 1, wherein the resin formulation further includes an acrylate, a free radical photo initiator, and a stabilizer.

8. The polymeric composition of claim 1 wherein the UV hardenable resin formulation further includes an epoxy selected from the group comprising bisphenol F epoxy, epoxy novolacs, and glycidyl ether of para amino phenol.

9. An electrically conductive material formed by exposing to UV radiation and subsequently heating a polymeric composition comprising:

a solventless, one par epoxy resin formulation, including between 33.6% and 54.9% by weight of an epoxide compound having at least two cycloaliphatic epoxide groups and a viscosity in the range of between about 200 cps and about 800 cps, between 11.8% and 14.0% by weight of a cationic photo initiator for initiating polymerization in response to UV radiation, between 0.1% and 10% by weight of a thermal cure catalyst for initiating polymerization in response to heat, between 1% and 17% by weight of reactive diluent, and between 12.5% and 33.6% by weight of a poly alcohol; and silver particles forming between about 85% and 89% by weight of the polymeric composition, wherein the volume resistivity of the UV hardened, thermally cured composition is no more than 20 µΩ-cm.

* * * * *

UNITED STATES PATENT AND TRADEMARK OFFICE
CERTIFICATE OF CORRECTION

PATENT NO. : 5,514,729            Page 1 of 2
DATED : May 7, 1996
INVENTOR(S) : Joram Diamant and Henry L. Myers It is certified that error appears in the above-indentified patent and that said Letters Patent is hereby corrected as shown below:

At column 2, line 63, delete "prenature" and insert --premature--.

At column 4, line 11 delete "$R' = (-O-\bigcirc-C R_1 R_1-\bigcirc-O-CH_2 CH O CH_2 -)$"

and insert --$R' = -O-\bigcirc-C R_1 R_1-\bigcirc-O-CH_2 CH O CH_2$--.

At column 4, lines 29, 54, and 60, delete "para amino phenol" and insert --para-aminophenol--.

At column 4, line 35, delete "R = R' =" and insert --$R = R_2 =$--.

At column 5, line 47, delete "77°" and insert -- 77° F--.

At column 6, line 24, delete "R vector" and insert --R factor--.

At column 7, line 13, delete "length of approximately" and insert --length of up to approximately--.

UNITED STATES PATENT AND TRADEMARK OFFICE
CERTIFICATE OF CORRECTION

PATENT NO. : 5,514,729
DATED : May 7, 1996
INVENTOR(S) : Joram Diamant and Henry L. Myers It is certified that error appears in the above-indentified patent and that said Letters Patent is hereby corrected as shown below:

At column 7, line 61, delete "ten minute" and insert --ten minutes--.

At column 10, line 51, delete "one par" and insert --one part--.

Signed and Sealed this

Eleventh Day of November, 1997

*Attest:*

BRUCE LEHMAN

*Attesting Officer*     Commissioner of Patents and Trademarks